United States Patent
Gao et al.

(10) Patent No.: US 9,911,439 B2
(45) Date of Patent: *Mar. 6, 2018

(54) MAGNETIC TUNNEL JUNCTION (MTJ) FREE LAYER DAMPING REDUCTION

(71) Applicant: Western Digital Technologies, Inc., Irvine, CA (US)

(72) Inventors: Zheng Gao, San Jose, CA (US); James Mac Freitag, Sunnyvale, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/673,816

(22) Filed: Aug. 10, 2017

(65) Prior Publication Data
US 2017/0372730 A1 Dec. 28, 2017

Related U.S. Application Data

(63) Continuation of application No. 15/195,947, filed on Jun. 28, 2016, now Pat. No. 9,734,850.

(51) Int. Cl.
| | |
|---|---|
| *G11B 5/39* | (2006.01) |
| *G11C 11/16* | (2006.01) |
| *H01L 27/22* | (2006.01) |
| *H01L 43/10* | (2006.01) |
| *H01L 43/02* | (2006.01) |

(52) U.S. Cl.
CPC .......... *G11B 5/3909* (2013.01); *G11C 11/161* (2013.01); *H01L 27/222* (2013.01); *H01L 43/02* (2013.01); *H01L 43/10* (2013.01)

(58) Field of Classification Search
CPC .......... G11B 5/39; G11B 5/3909; G11B 5/398
USPC .............. 360/324, 324.1–324.12, 324.2, 326
See application file for complete search history.

(56) References Cited

U.S. PATENT DOCUMENTS

| | | | | |
|---|---|---|---|---|
| 2005/0254287 A1* | 11/2005 | Valet | ...................... | G11C 11/16 365/158 |
| 2013/0222949 A1* | 8/2013 | Braganca | ............. | G01R 33/093 360/324.11 |
| 2015/0098153 A1* | 4/2015 | Carey | .................... | G01R 33/00 360/235.4 |
| 2015/0129993 A1* | 5/2015 | Tang | ....................... | H01L 43/10 257/421 |
| 2015/0372687 A1* | 12/2015 | Buhrman | ............. | H03B 15/006 331/94.1 |

* cited by examiner

*Primary Examiner* — Allen T Cao
(74) *Attorney, Agent, or Firm* — Foley & Lardner LLP

(57) ABSTRACT

In one embodiment, a system includes a sensor, the sensor having a free layer, a ferromagnetic spin sink layer spaced from the free layer, the spin sink layer being operative to reduce a spin-induced damping in the free layer during operation of the sensor, and a nonmagnetic spacer layer positioned between the free layer and the spin sink layer, the spacer layer having a long spin-diffusion length.

20 Claims, 9 Drawing Sheets

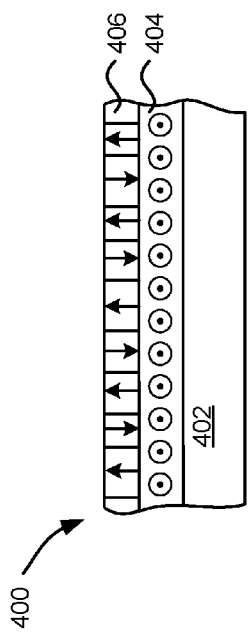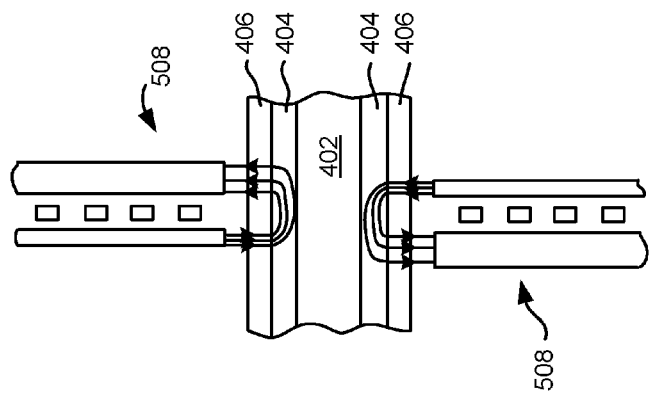

MAGNETIC TUNNEL JUNCTION (MTJ) FREE LAYER DAMPING REDUCTION

CROSS REFERENCE TO RELATED PATENT APPLICATIONS

This application is a continuation of U.S. patent application Ser. No. 15/195,947, filed on Jun. 28, 2016, the entirety of which is incorporated by reference herein.

FIELD OF THE INVENTION

The present invention relates to data storage systems, and more particularly, this invention relates to reducing Gilbert damping of the free layer in the magnetic tunnel junction of magnetic heads and magnetic random access memory devices.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected data tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, it is desired that HDDs be able to store more information in their limited area and volume. A technical approach to meet this desire is to increase the capacity by increasing the recording density of the HDD. To achieve higher recording density, further miniaturization of recording bits is effective, which in turn typically requires the design of smaller and smaller components.

With advances in higher recording density, however, secondary factors such as damping caused by magnetism of the free layer have become important. As areal density increases, magnetic noise caused by the damping coefficient of the free layer becomes a limiting factor to increase the signal-to-noise ratio (SNR). It would be desirable, therefore, to develop a system that lowers the damping coefficient, thereby lowering the noise and allowing the highest possible SNR.

SUMMARY

In one embodiment, a system includes a sensor, the sensor having a free layer, a ferromagnetic spin sink layer spaced from the free layer, the spin sink layer being operative to reduce a spin-induced damping in the free layer during operation of the sensor, and a nonmagnetic spacer layer positioned between the free layer and the spin sink layer, the spacer layer having a long spin-diffusion length.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 4 is a schematic representation of a perpendicular recording medium, according to one embodiment.

FIG. 5A is a schematic representation of a recording head and the perpendicular recording medium of FIG. 4, according to one embodiment.

FIG. 5B is a schematic representation of a recording apparatus configured to record separately on both sides of a perpendicular recording medium, according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems and/or related systems and methods, as well as operation and/or component parts thereof.

In one general embodiment, a system includes a sensor, the sensor having a free layer, a ferromagnetic spin sink layer spaced from the free layer, the spin sink layer being operative to reduce a spin-induced damping in the free layer during operation of the magnetic head, and a nonmagnetic spacer layer positioned between the free layer and the spin sink layer, the spacer layer having a long spin-diffusion length.

Figure 1:
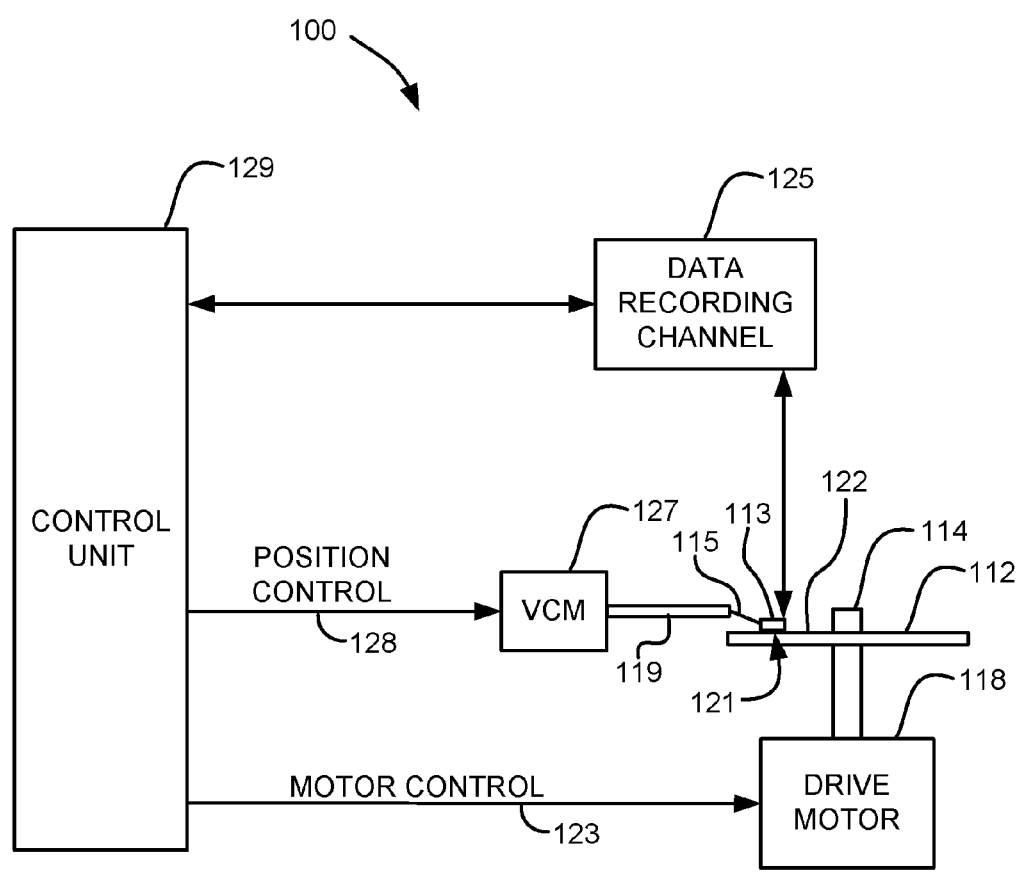
FIG. 1 is a simplified drawing of a magnetic recording disk drive system, according to one embodiment.

Referring now to FIG. 1, there is shown a disk drive 100 in accordance with one embodiment of the present invention. As shown in FIG. 1, at least one rotatable magnetic medium (e.g., magnetic disk) 112 is supported on a spindle 114 and rotated by a drive mechanism, which may include a disk drive motor 118. The magnetic recording on each disk is typically in the form of an annular pattern of concentric data tracks (not shown) on the disk 112. Thus, the disk drive motor 118 preferably passes the magnetic disk 112 over the magnetic read/write portions 121, described immediately below.

At least one slider 113 is positioned near the disk 112, each slider 113 supporting one or more magnetic read/write portions 121, e.g., of a magnetic head according to any of the approaches described and/or suggested herein. As the disk rotates, slider 113 is moved radially in and out over disk surface 122 so that portions 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122. In other embodiments the bearing may comprise a gas other than air, e.g. helium.

The various components of the disk storage system are controlled in operation by control signals generated by controller 129, such as access control signals and internal clock signals. Typically, control unit 129 comprises logic control circuits, storage (e.g., memory), and a microprocessor. In a preferred approach, the control unit 129 is electrically coupled (e.g., via wire, cable, line, etc.) to the one or more magnetic read/write portions 121, for controlling operation thereof. The control unit 129 generates control signals to control various system operations such as drive motor control signals on line 123 and head position and seek control signals on line 128. The control signals on line 128 provide the desired current profiles to optimally move and position slider 113 to the desired data track on disk 112.

Read and write signals are communicated to and from read/write portions 121 by way of recording channel 125.

The above description of a magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

Regarding a magnetic head, an inductive write portion therein includes a coil layer embedded in one or more insulation layers (insulation stack), the insulation stack being located between first and second pole piece layers. A gap may be formed between the first and second pole piece layers by a gap layer at an air bearing surface (ABS) of the write portion. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

Figure 2A:
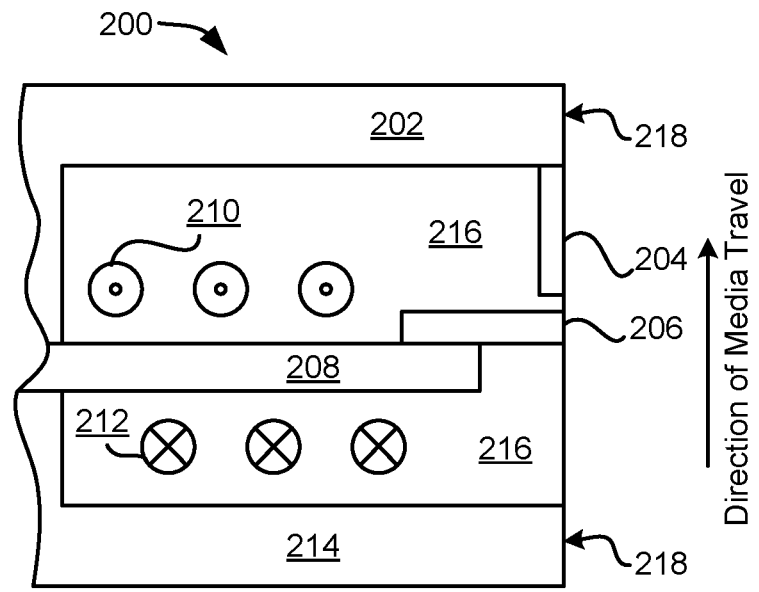
FIG. 2A is a cross-sectional view of a perpendicular magnetic head with helical coils, according to one embodiment.

FIG. 2A is a cross-sectional view of a perpendicular magnetic head 200, according to one embodiment. In FIG. 2A, helical coils 210 and 212 are used to create magnetic flux in the stitch pole 208, which then delivers that flux to the main pole 206. Coils 210 indicate coils extending out from the page, while coils 212 indicate coils extending into the page. Stitch pole 208 may be recessed from the ABS 218. Insulation 216 surrounds the coils and may provide support for some of the elements. The direction of the media travel, as indicated by the arrow to the right of the structure, moves the media past the lower return pole 214 first, then past the stitch pole 208, main pole 206, trailing shield 204 which may be connected to the wrap around shield (not shown), and finally past the upper return pole 202. Each of these components may have a portion in contact with the ABS 218. The ABS 218 is indicated across the right side of the structure.

Perpendicular writing is achieved by forcing flux through the stitch pole 208 into the main pole 206 and then to the surface of the disk positioned towards the ABS 218.

Figure 2B:
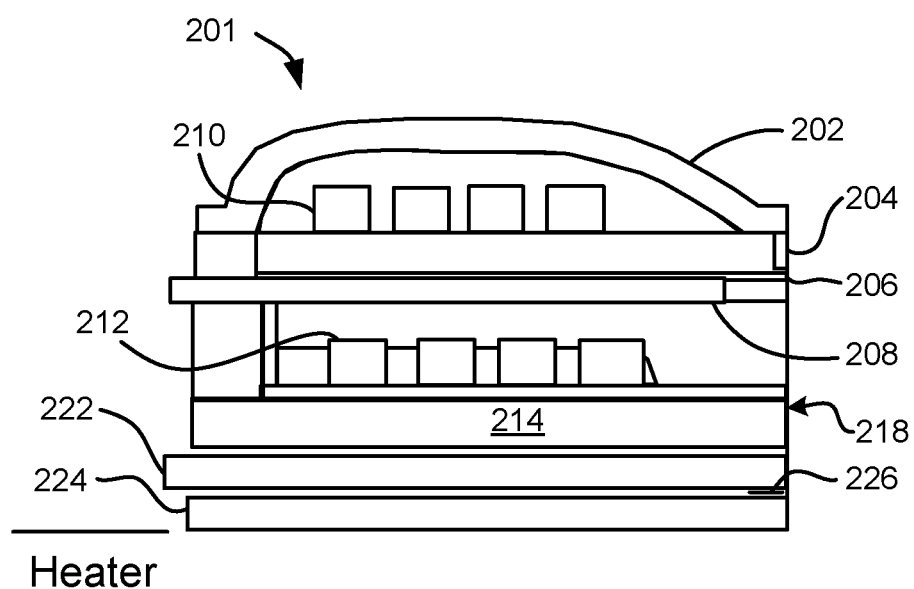
FIG. 2B is a cross-sectional view a piggyback magnetic head with helical coils, according to one embodiment.

FIG. 2B illustrates one embodiment of a piggyback magnetic head 201 having similar features to the head 200 of FIG. 2A. As shown in FIG. 2B, two shields 204, 214 flank the stitch pole 208 and main pole 206. Also sensor shields 222, 224 are shown. The sensor 226 is typically positioned between the sensor shields 222, 224.

Figure 3A:
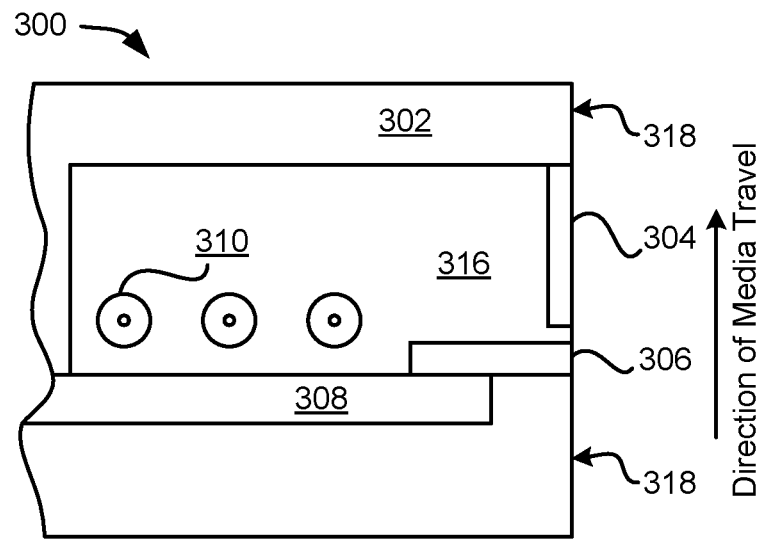
FIG. 3A is a cross-sectional view of a perpendicular magnetic head with looped coils, according to one embodiment.

FIG. 3A is a schematic diagram of another embodiment of a perpendicular magnetic head 300, which uses looped coils 310 to provide flux to the stitch pole 308, a configuration that is sometimes referred to as a pancake configuration. The stitch pole 308 provides the flux to the main pole 306. With this arrangement, the lower return pole may be optional. Insulation 316 surrounds the coils 310, and may provide support for the stitch pole 308 and main pole 306. The stitch pole may be recessed from the ABS 318. The direction of the media travel, as indicated by the arrow to the right of the structure, moves the media past the stitch pole 308, main pole 306, trailing shield 304 which may be connected to the wrap around shield (not shown), and finally past the upper return pole 302 (all of which may or may not have a portion in contact with the ABS 318). The ABS 318 is indicated across the right side of the structure. The trailing shield 304 may be in contact with the main pole 306 in some embodiments.

Figure 3B:
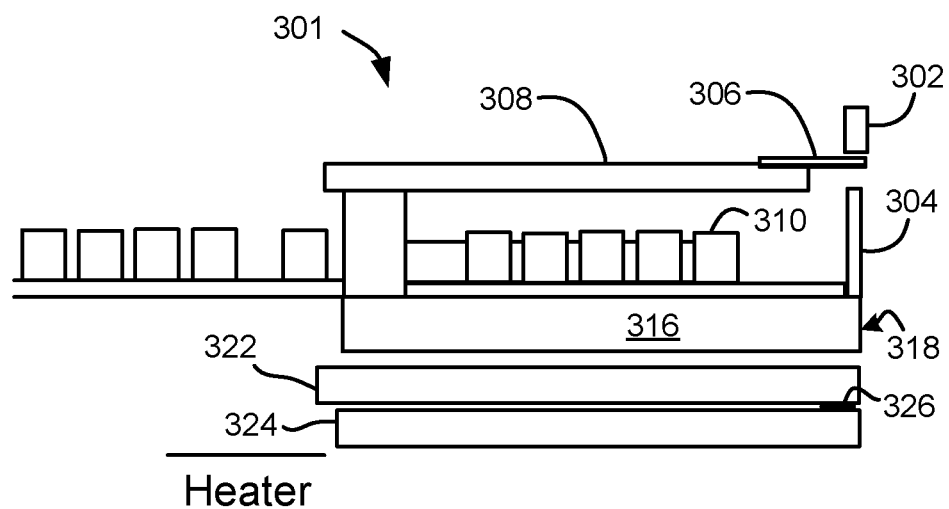
FIG. 3B is a cross-sectional view of a piggyback magnetic head with looped coils, according to one embodiment.

FIG. 3B illustrates another embodiment of a piggyback magnetic head 301 having similar features to the head 300 of FIG. 3A. As shown in FIG. 3B, the piggyback magnetic head 301 also includes a looped coil 310, which wraps around to form a pancake coil. Sensor shields 322, 324 are additionally shown. The sensor 326 is typically positioned between the sensor shields 322, 324.

In FIGS. 2B and 3B, an optional heater is shown near the non-ABS side of the magnetic head. A heater (Heater) may also be included in the magnetic heads shown in FIGS. 2A and 3A. The position of this heater may vary based on design parameters such as where the protrusion is desired, coefficients of thermal expansion of the surrounding layers, etc.

FIG. 4 provides a schematic diagram of a simplified perpendicular recording medium 400, which may also be used with magnetic disk recording systems, such as that shown in FIG. 1. As shown in FIG. 4, the perpendicular recording medium 400, which may be a recording disk in various approaches, comprises at least a supporting substrate 402 of a suitable non-magnetic material (e.g., glass, aluminum, etc.), and a soft magnetic underlayer 404 of a material having a high magnetic permeability positioned above the substrate 402. The perpendicular recording medium 400 also includes a magnetic recording layer 406 positioned above the soft magnetic underlayer 404, where the magnetic recording layer 406 preferably has a high coercivity relative to the soft magnetic underlayer 404. There may one or more additional layers (not shown), such as an "exchange-break" layer or "interlayer", between the soft magnetic underlayer 404 and the magnetic recording layer 406.

The orientation of magnetic impulses in the magnetic recording layer 406 is substantially perpendicular to the surface of the recording layer. The magnetization of the soft magnetic underlayer 404 is oriented in (or parallel to) the plane of the soft underlayer 404. As particularly shown in FIG. 4, the in-plane magnetization of the soft magnetic underlayer 404 may be represented by an arrow extending into the paper.

FIG. 5A illustrates the operative relationship between a perpendicular head 508 and the perpendicular recording medium 400 of FIG. 4. As shown in FIG. 5A, the magnetic flux 510, which extends between the main pole 512 and return pole 514 of the perpendicular head 508, loops into and out of the magnetic recording layer 406 and soft magnetic underlayer 404. The soft magnetic underlayer 404 helps focus the magnetic flux 510 from the perpendicular head 508 into the magnetic recording layer 406 in a direction generally perpendicular to the surface of the magnetic medium. Accordingly, the intense magnetic field generated between the perpendicular head 508 and the soft magnetic underlayer 404, enables information to be recorded in the magnetic recording layer 406. The magnetic flux is further channeled by the soft magnetic underlayer 404 back to the return pole 514 of the head 508.

As noted above, the magnetization of the soft magnetic underlayer 404 is oriented in (parallel to) the plane of the soft magnetic underlayer 404, and may represented by an arrow extending into the paper. However, as shown in FIG. 5A, this in plane magnetization of the soft magnetic underlayer 404 may rotate in regions that are exposed to the magnetic flux 510.

FIG. 5B illustrates one embodiment of the structure shown in FIG. 5A, where soft magnetic underlayers 404 and magnetic recording layers 406 are positioned on opposite sides of the substrate 402, along with suitable recording heads 508 positioned adjacent the outer surface of the magnetic recording layers 406, thereby allowing recording on each side of the medium.

Except as otherwise described herein with reference to the various inventive embodiments, the various components of the structures of FIGS. 1-5B, and of other embodiments disclosed herein, may be of conventional material(s), design, and/or fabricated using conventional techniques, as would become apparent to one skilled in the art upon reading the present disclosure.

Gilbert damping is a force that opposes the precessions of the magnetic spins created from the free layer in a magnetic device. The damping can be translated into thermal magnetic noise, using the Gilbert damping coefficient, which has been shown to be inversely proportional to signal-to-noise ratio (SNR) such that increased reader magnetic noise, e.g., lowers SNR. In magnetic heads, it would be advantageous to lower the thermal magnetic noise generated by damping from the free layer.

In a magnetic random access memory (MRAM) device, lowering the effect of damping is critical for lowering the switching current as applied to low power memory applications. Contemplated approaches employ a magnesium oxide (MgO) cap to suppress spin pumping to lower the damping coefficient. Specifically, the MgO cap reflects the spin current generated by the free layer back into the free layer. However, the typically thick MgO cap used in this case may not be practical for low resistant area (RA) products, for example, MTJs in magnetic heads. The magnetic heads have a lower resistance tolerance than MRAM. Reducing the depth of the MgO cap decreases the resistance; but if the cap is too thin, then there is less effect on reducing the dampening effect and the RA is detrimentally affected. Damping can also be modified by varying the materials that form the free layer; however, such an approach may also unfavorably change other properties of the free layer.

Various embodiments described and/or suggested herein overcome the foregoing challenges by inserting a spacer with long spin diffusion length between the free layer and a ferromagnetic (FM) layer, which can modify the damping without modifying the constituents of the free layer.

Figure 6:
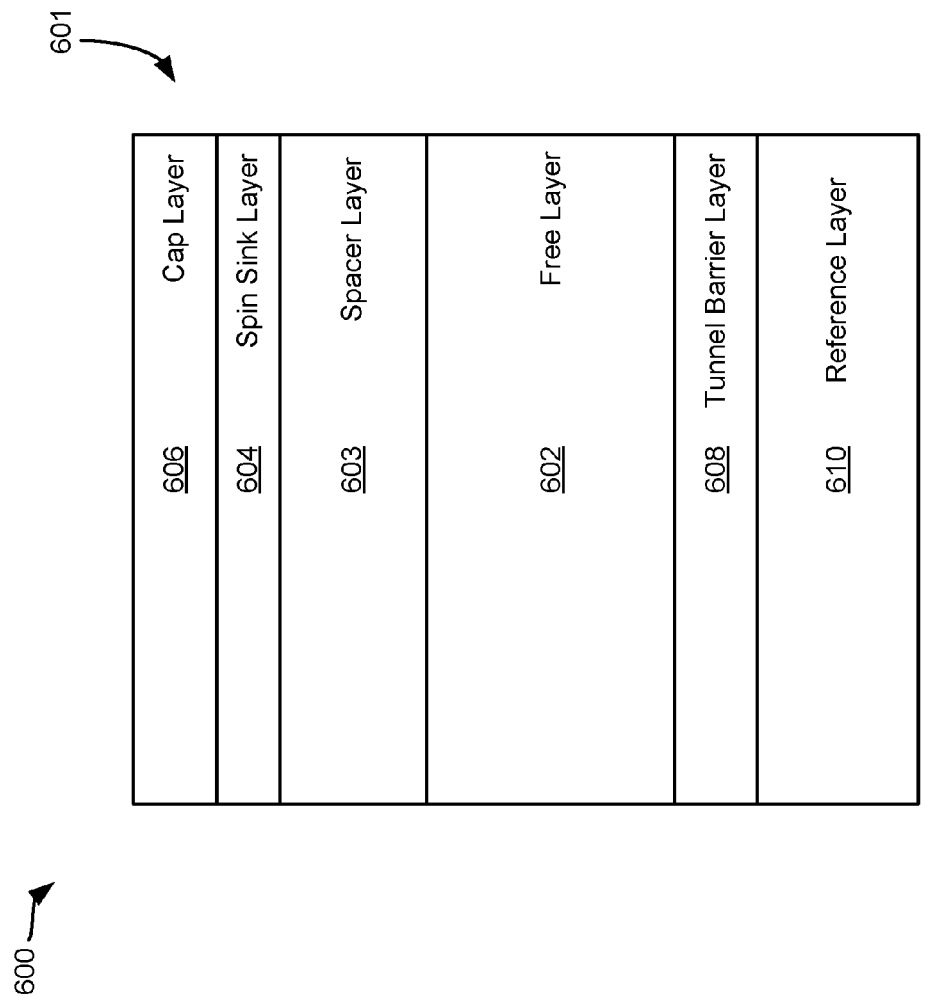
FIG. 6 is a schematic representation of portions of the magnetic tunnel junction according to one embodiment.

FIG. 6 depicts a system 600 having an element 601 in accordance with one embodiment. As an option, the present system 600 may be implemented in conjunction with features from any other embodiment listed herein, such as those described with reference to the other FIGS. Of course, however, such system 600 and others presented herein may be used in various applications and/or in permutations which may or may not be specifically described in the illustrative embodiments listed herein. Further, the system 600 presented herein may be used in any desired environment.

The system 600 may be a magnetic recording device such as a magnetic data storage drive. The element 601 may be a magnetic sensor of such magnetic recording device. In other embodiments, the system 600 may be an MRAM device. The element 601 may be a component of a memory cell, e.g., a magnetic tunnel junction (MTJ), of such MRAM device.

Referring now to FIG. 6, in some embodiments, the element 601 of system 600 includes a free layer 602, and a ferromagnetic spin sink layer 604 spaced from the free layer 602, the spin sink layer 604 being operative to reduce a spin-induced damping in the free layer 602 during operation. For example, upon passage of a current therethrough by read channel circuitry of a controller in one embodiment.

The element 601 further includes a nonmagnetic spacer layer 603 positioned between the free layer 602 and the spin sink layer 604, and a cap layer 606. Positioned on an opposite side of the free layer 602 are a tunnel barrier layer 608 and a reference layer 610. The free layer 602, tunnel barrier layer 608, reference layer 610 and cap layer 606 may be of conventional construction.

The spacer layer 603 may have a long spin-diffusion length, for example, when constructed of copper, such that electrons can travel across the spacer layer 603 without scattering or flipping. The polarization of the electrons tends to be undisturbed by such a layer with a long spin diffusion length. However, a layer of material with a short spin diffusion length, such as tantalum in the cap layer 606 would create an environment for spin scatter resulting in a damping effect and spin pumping.

Figure 7:
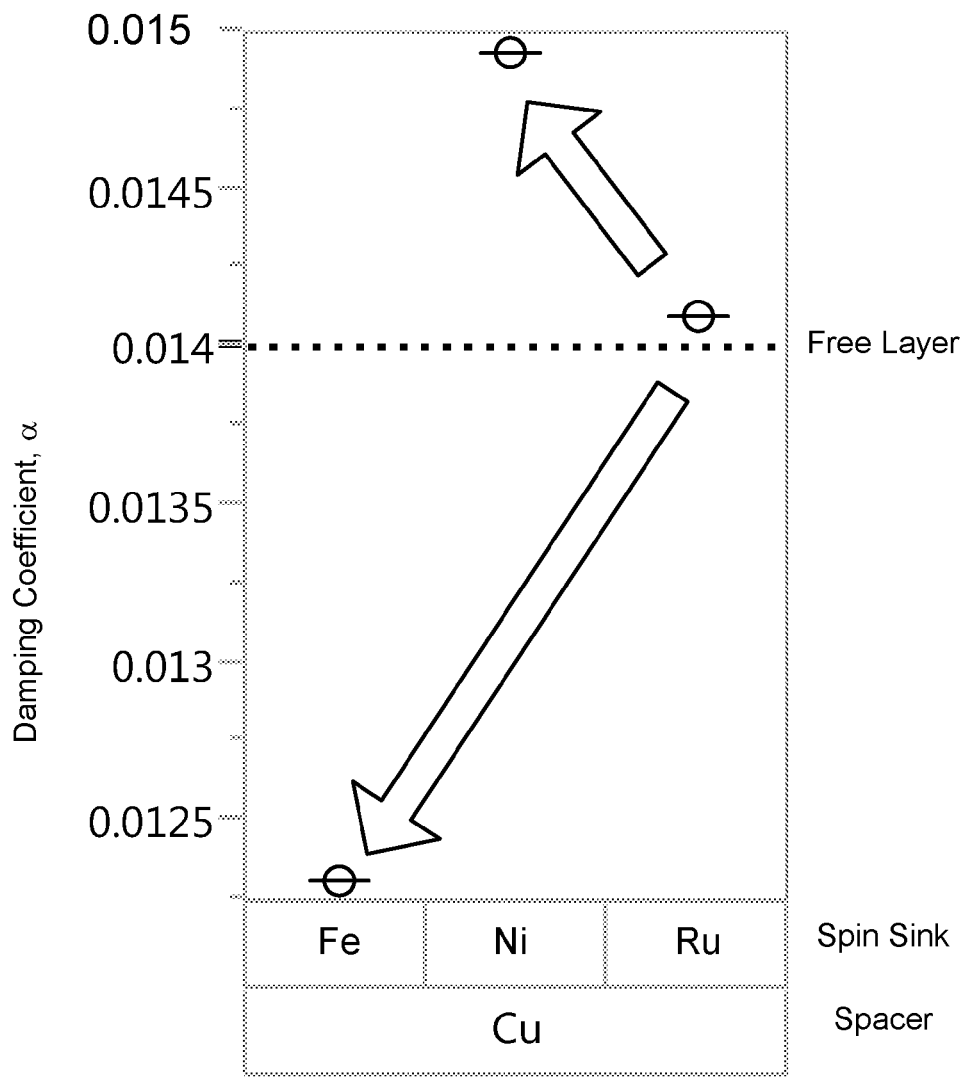
FIG. 7 is a graph showing the damping coefficients for various embodiments.

Insertion of a spin sink layer 604 on an opposite side of the spacer layer 603 as the free layer 602, modifies the damping generated by the free layer, where such damping is dependent on the composition of the spin sink layer 604. FIG. 7 illustrates the ferromagnetic resonance (FMR) measurement of the Gilbert damping coefficient α (y axis of FIG. 7) of sample element compositions according to some approaches. The damping coefficient α for the free layer is 0.014 (dotted line, FIG. 7). For comparison, the graph shows two different compositions of the spin sink layer (604 in FIG. 6) each with a copper spacer layer (603 in FIG. 6) positioned between the cap layer (606 in FIG. 6, in this case Ru—Ta—Ru, and depicted as Ru in FIG. 7) and the free layer (602 in FIG. 6). Placing the copper spacer between the cap layer containing ruthenium Ru and the free layer shows that the damping coefficient of the free layer is unchanged with the damping coefficient at the expected 0.014 (dotted line, FIG. 7). In contrast, insertion of a spin sink layer between the copper layer and the cap layer has a remarkable effect on the damping coefficient α. Nickel (Ni in FIG. 7) is a material known to have a very high damping effect, and as such the presence of Ni in the spin sink layer seems to increase the damping coefficient of the free layer (from 0.014 to nearly 0.015, FIG. 7). Iron (Fe in FIG. 7) is a material known to have a low damping effect, and as such the presence of Fe in the spin sink layer seems to significantly decrease the damping coefficient of the free layer (from 0.014 to less than 0.0125, FIG. 7). Thus, in some embodiments, the damping generated by the free layer may be modified with a spin sink layer via the spacer without modifying the free layer.

In one embodiment, the spacer layer 603 may be comprised of copper which has a very long spin diffusion length, greater than 100 nm. Moreover, a spacer layer 603 of copper of only 4 nm may be essentially transparent to the electrons traveling through the layer. In other embodiments, the spacer layer 603 may be any nonmagnetic conductive metals with a long spin diffusion length, for example, silver-tin alloys, silver and gold, and alloys of silver and gold.

In some approaches, the deposition thickness of the spacer layer 603 may be below a spin diffusion length, as determined by conventional methods, of a material composition of the spacer layer 603. For example, although the spin diffusion length of copper is 100 nm and so a Cu spacer layer with any thickness well below the spin diffusion length may be used, the optimal thickness for the spacer layer within the element may be about 4 nm, e.g., to fit within a structure having a defined shield-to-shield read gap.

Furthermore, in yet another embodiment, the deposition thickness of the spacer layer 603 may be sufficient to prevent substantial magnetic coupling of the free layer 602 and the spin sink layer 604. In optimal conditions, the deposition thickness of the spacer layer 603 may allow the free layer 602 to synchronize with the spin sink layer 604 independent of magnetic coupling, and thus the damping effect may be reduced. In sharp contrast, less desirable approaches demonstrate that absence of the spacer layer may cause the spin sink layer to become magnetically coupled to the free layer thereby becoming indistinguishable from the free layer and changing the total moment of the free layer, which is an important parameter to control in a magnetic recording head.

Figure 8:
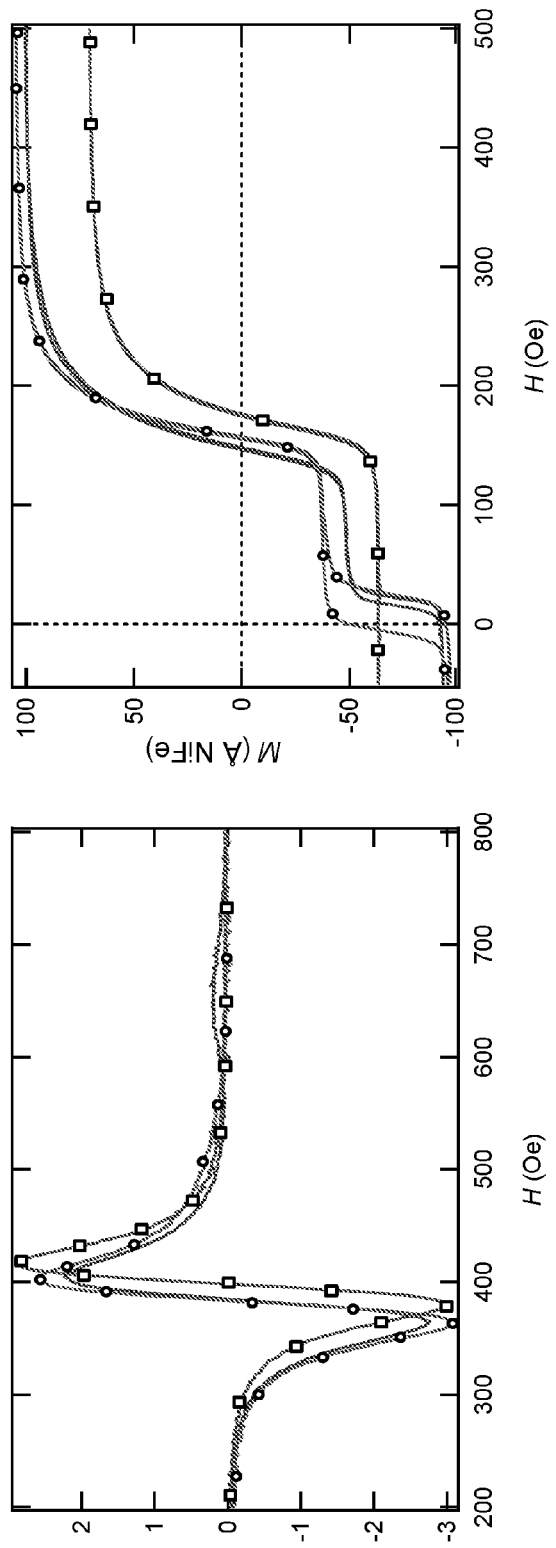
FIG. 8A is a graph showing ferromagnetic resonance (FMR) of the effect of an iron spin sink layer according to one embodiment.
FIG. 8B is a graph of the magnetization of including an iron spin sink layer according to one embodiment using a vibrating sample magnetometer (VSM).

As further illustrated in FIGS. 8A-8B, in preferred embodiments, the position of the spacer layer sandwiched between the free layer and the spin sink layer may allow the spin sink layer and free layer to function in coupled oscillation (FIG. 8A) while being magnetically decoupled from each other (FIG. 8B). A graph of the derivative of FMR (FIG. 8A) shows the spin sink layer (Fe) functions independent of the free layer (Free) when a spin reflective layer (MgO) is inserted between the spin sink layer and the copper spacer/free layer (see solid line, FIG. 8A). The spin sink layer oscillates at a different frequency than the free layer as indicated by the second peak in the sample with the spin reflective layer (solid line). In contrast, without the MgO layer, the free layer (Free) and the spin sink layer (Fe), with the copper (Cu) layer in between, are synchronized as shown by the single peak and the absence of the second peak (circle line, FIG. 8A). The peak for the coupled oscillation shows similar behavior to the FMR response of the free layer by itself without an additional spin sink layer (square line, FIG. 8A). The inventors believe that the coupled oscillation of the spin sink layer on top of the free layer with the spacer layer in between contributes to the spin sink layer regulation of the damping of the free layer, while this effect is removed by insertion of an MgO layer that reflects the spin current.

In a preferred embodiment, the presence of the spacer layer between the free layer and the spin sink layer allows the two layers to be magnetically decoupled as demonstrated in FIG. 8B which depicts the magnetization of sensor samples using a vibrating sample magnetometer (VSM). The presence of the copper spacer (Cu) between the free layer (Free) and the spin sink layer (Fe) (circle line, FIG. 8B) shows two distinct magnetic hysteresis loops compared to the single loop shown with copper spacer alone and no additional ferromagnetic spin sink layer (square line, FIG. 8B). As expected and similar to the configuration of Free-Cu—Fe sensor (circle line, FIG. 8B), the presence of the spin reflective layer, MgO (solid line, FIG. 8B) above the spin sink layer show similar magnetization properties by VSM. The inventors believe both sensor samples, with the Cu-spin sink layer configuration either with or without MgO demonstrate that the spin sink layer is magnetically decoupled from the free layer.

With continued reference to FIG. 6, in some embodiments the spin sink layer 604, or ferromagnetic layer, may have a deposition thickness in a range of about 1 nm to about 5 nm, preferably about 2 nm. In some approaches, the spin sink layer 604 may be composed of ferromagnetic material, for example, iron, nickel, cobalt, Heusler alloys such as $Co_2MnGe$, and combinations thereof.

Figure 9:
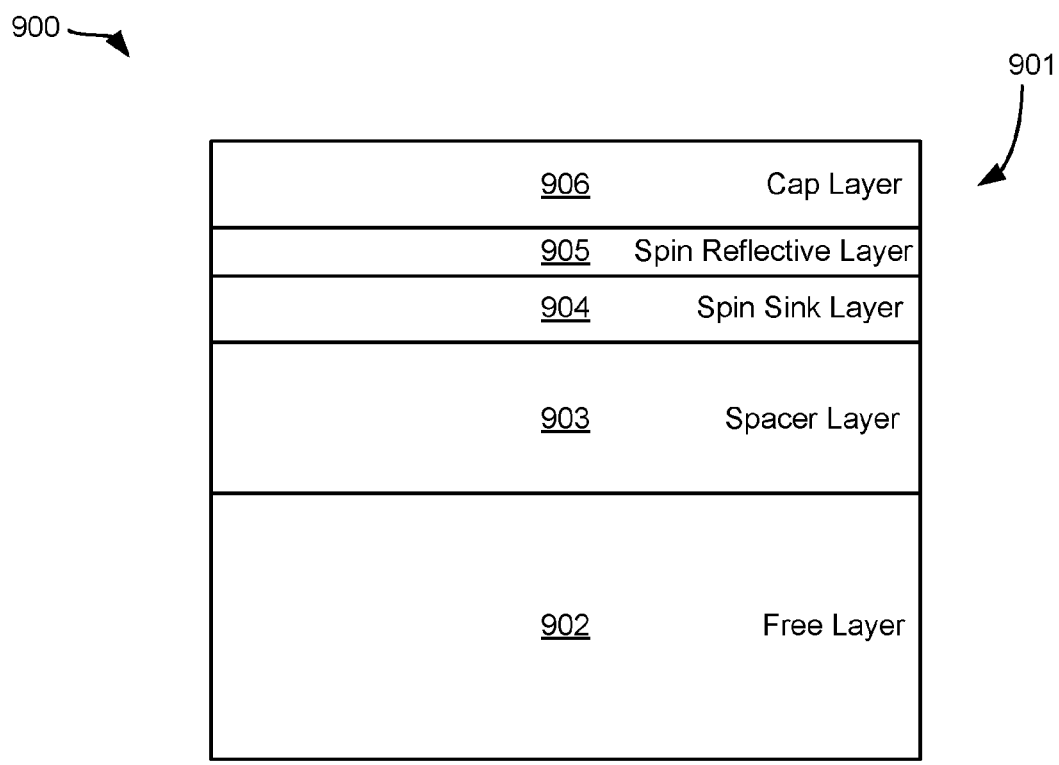
FIG. 9 is a schematic representation of a portion of the magnetic tunnel junction according to one embodiment.

FIG. 9 depicts a system 900 having an element 901 in accordance with one embodiment. As an option, the present system 900 may be implemented in conjunction with features from any other embodiment listed herein, such as those described with reference to the other FIGS. Of course, however, such system 900 and others presented herein may be used in various applications and/or in permutations which may or may not be specifically described in the illustrative embodiments listed herein. Further, the system 900 presented herein may be used in any desired environment.

The system 900 may be a magnetic recording device such as a magnetic data storage drive. The element 901 may be a magnetic sensor of such magnetic recording device. In other embodiments, the system 900 may be an MRAM device. The element 901 may be a component of a memory cell, e.g., a magnetic tunnel junction (MTJ), of such MRAM device.

As depicted in the system 900 in FIG. 9, a preferred embodiment of the element 901 includes a spin reflective layer 905 that may be added to further modify the damping effect of the free layer 902. The spin reflective layer 905 is preferably positioned below the cap layer 906, on an opposite side of the spin sink layer 904 than the spacer 903 and free layer 902. In some embodiments, the spin reflection layer 905 may be comprised of a material having spin reflective properties, such as magnesium oxide, tantalum oxide, ruthenium oxide, hafnium oxide, etc, or by oxidizing the top surface of the ferromagnetic spin sink layer 904. In some approaches, the deposition thickness of the spin reflection layer may be within a range of about 0.1 to about 1 nm. In a preferred embodiment, the thickness of the spin reflection layer will be optimally thin enough for optimal resistance and thick enough for optimal reflection.

Figures 10A, 10B:
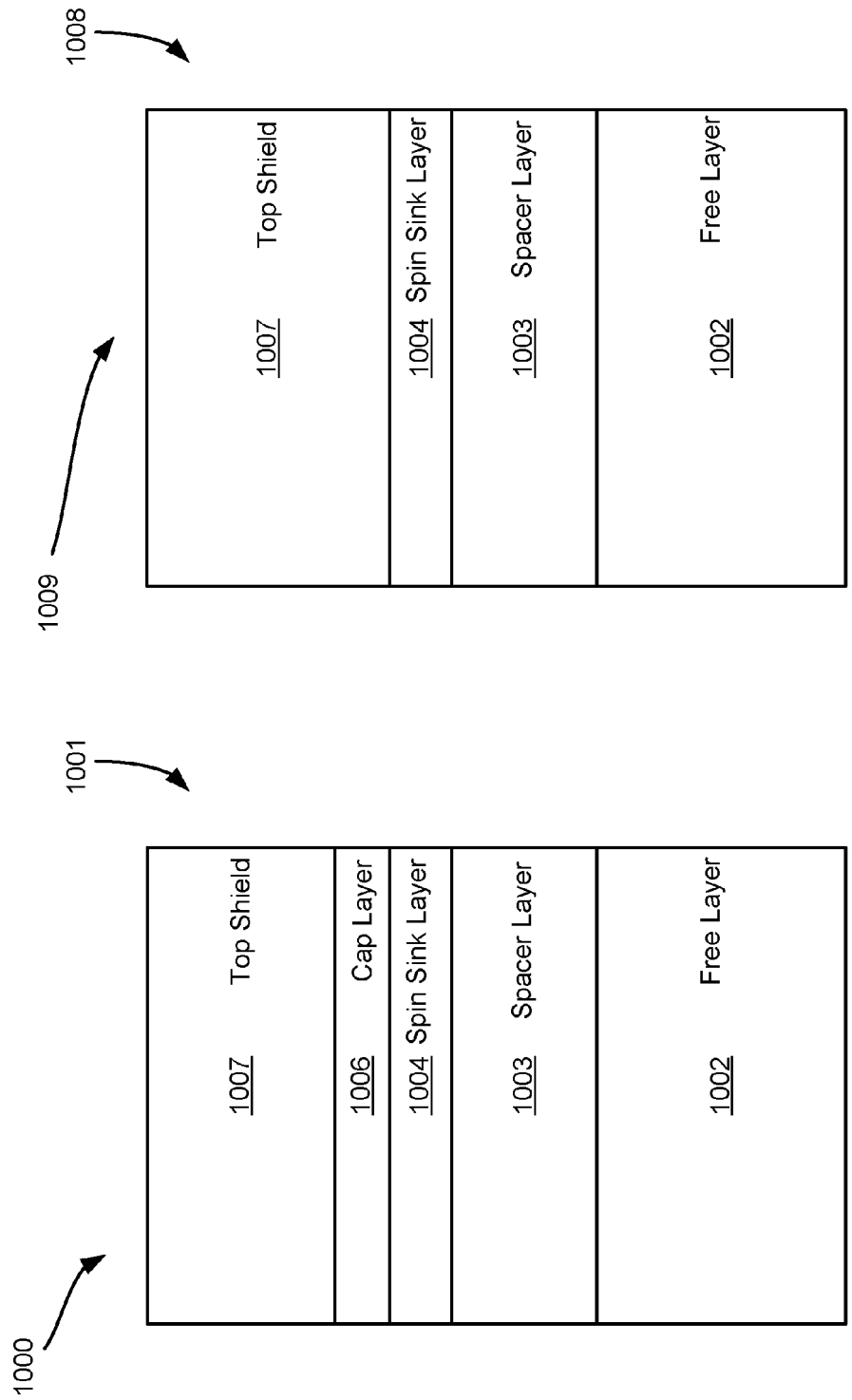
FIG. 10A is a schematic representation of portions of the magnetic tunnel junction according to one embodiment.
FIG. 10B is a schematic representation of portions of the magnetic tunnel junction according to one embodiment.

FIG. 10A-B depicts systems 1000, 1009 having a sensor in accordance with additional embodiments. As an option, the present systems 1000, 1009 may be implemented in conjunction with features from any other embodiment listed herein, such as those described with reference to the other FIGS. Of course, however, such systems 1000, 1009 and others presented herein may be used in various applications and/or in permutations which may or may not be specifically described in the illustrative embodiments listed herein. Further, the systems 1000, 1009 presented herein may be used in any desired environment.

The systems 1000, 1009 may be magnetic recording devices such as a magnetic data storage drive. In other embodiments, the systems 1000, 1009 may be MRAM devices.

As depicted in the system 1000 in FIG. 10A, a preferred embodiment of the element 1001 illustrates a floating shield design that may include a nonmagnetic cap layer 1006 above the spin sink layer 1004. In some approaches, the top shield 1007 may be positioned above the nonmagnetic cap layer 1006 and the spin sink layer 1004 may be positioned between the spacer layer 1003 and the cap layer 1006. The spacer layer 1003 in the floating shield design (depicted in FIG. 10A) allows the spin sink layer 1004 to float, or be magnetically decoupled, from the free layer 1002, while the cap layer 1006 allows the spin sink layer 1004 to be magnetically decoupled from the top shield 1007. While the precise mechanism is not known, and without wishing to be bound by any theory, the inventors believe the floating shield design improves linear resolution of the read head.

In system 1009 of FIG. 10B, the element 1008 may have a configuration as shown in FIG. 10B in which the spin sink layer 1004, using conventional methods, is stitched and magnetically coupled into the shield 1007; specifically, the top shield 1007 is positioned directly on the spin sink layer 1004. In some embodiments, the spin sink layer 1004 may be tuned to the top shield 1007 so that the two layers may be properly recessed in the sensor 1008 configuration.

It should be noted that methodology presented herein for at least some of the various embodiments may be implemented, in whole or in part, in computer hardware, software, by hand, using specialty equipment, etc. and combinations thereof.

Moreover, any of the structures and/or steps may be implemented using known materials and/or techniques, as would become apparent to one skilled in the art upon reading the present specification.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic sensor comprising:
   a free layer;
   a spin sink layer; and
   a nonmagnetic spacer layer between the free layer and the spin sink layer, wherein the spin sink layer is configured to adjust a spin-induced damping in the free layer during operation of the magnetic sensor.

2. The magnetic sensor of claim 1, further comprising a nonmagnetic cap layer that is separated from the free layer by the spin sink layer and the nonmagnetic spacer layer.

3. The magnetic sensor of claim 2, further comprising a shield on the cap layer.

4. The magnetic sensor of claim 1, wherein the nonmagnetic spacer layer comprises copper.

5. The magnetic sensor of claim 1, wherein the nonmagnetic spacer layer comprises one of silver and tin alloy, gold, and silver.

6. The magnetic sensor of claim 1, wherein the nonmagnetic spacer layer comprises a spin diffusion length that is greater than a deposition thickness of the nonmagnetic spacer layer.

7. The magnetic sensor of claim 6, wherein the spin diffusion length of the nonmagnetic spacer layer is about one hundred nanometers and the deposition thickness of the nonmagnetic spacer layer is about four nanometers.

8. The magnetic sensor of claim 1, further comprising a spin reflective layer, wherein the spin sink layer is between the spin reflective layer and the nonmagnetic spacer layer.

9. The magnetic sensor of claim 8, wherein the spin reflective layer comprises one of magnesium oxide, tantalum oxide, ruthenium oxide, and hafnium oxide.

10. The magnetic sensor of claim 8, wherein a deposition thickness of the spin reflective layer is about one tenth of a nanometer to about one nanometer.

11. The magnetic sensor of claim 1, wherein the spin sink layer comprises nickel to increase a damping coefficient of the free layer.

12. The magnetic sensor of claim 1, wherein the spin sink layer comprises iron to decrease a damping coefficient of the free layer.

13. The magnetic sensor of claim 1, wherein the spin sink layer comprises a deposition thickness of about one nanometer to about five nanometers.

14. The magnetic sensor of claim 1, wherein the spin sink layer comprises one of iron, nickel, cobalt, and Heusler alloys.

15. A magnetic sensor comprising:
a free layer;
a spin sink layer; and
a nonmagnetic spacer layer between the free layer and the spin sink layer, wherein the nonmagnetic spacer layer is configured with a spin diffusion length that is greater than a deposition thickness of the nonmagnetic spacer layer.

16. The magnetic sensor of claim 15, wherein the spin diffusion length of the nonmagnetic spacer layer is about one hundred nanometers and the deposition thickness of the nonmagnetic spacer layer is about four nanometers.

17. The magnetic sensor of claim 15, wherein a deposition thickness of the nonmagnetic spacer layer is configured to prevent substantial magnetic coupling between the free layer and the spin sink layer.

18. A magnetic sensor comprising:
a free layer;
a spin sink layer, wherein the spin sink layer is configured to reduce a spin-induced damping in the free layer during operation of the magnetic sensor; and
a nonmagnetic spacer layer between the free layer and the spin sink layer, wherein the nonmagnetic spacer layer is configured with a spin diffusion length that is greater than a deposition thickness of the nonmagnetic spacer layer.

19. The magnetic sensor of claim 18, further comprising a spin reflective layer, wherein the spin sink layer is between the spin reflective layer and the nonmagnetic spacer layer.

20. The magnetic sensor of claim 18, further comprising a shield adjacent to the spin sink layer, wherein the spin sink layer is between the shield and the nonmagnetic spacer layer.

* * * * *